(12) United States Patent
Moyer et al.

(10) Patent No.: US 10,260,940 B2
(45) Date of Patent: Apr. 16, 2019

(54) LIGHT SOURCE DRIVING CIRCUITRY FOR ELECTRONIC DEVICES

(71) Applicant: Apple Inc., Cupertino, CA (US)

(72) Inventors: Todd K. Moyer, Portland, OR (US); Jonathan R. Peterson, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 308 days.

(21) Appl. No.: 15/068,367

(22) Filed: Mar. 11, 2016

(65) Prior Publication Data

US 2017/0264076 A1 Sep. 14, 2017

(51) Int. Cl.
| | |
|---|---|
| *G01J 1/32* | (2006.01) |
| *G01J 1/46* | (2006.01) |
| *H05B 37/02* | (2006.01) |
| *H01S 5/042* | (2006.01) |
| *H01S 5/068* | (2006.01) |

(52) U.S. Cl.
CPC .............. *G01J 1/46* (2013.01); *G01J 1/32* (2013.01); *H01S 5/0428* (2013.01); *H05B 37/0245* (2013.01); *H01S 5/06808* (2013.01)

(58) Field of Classification Search
CPC ......... H01S 5/042; G01J 1/46; H05B 37/0245
See application file for complete search history.

(56) References Cited

U.S. PATENT DOCUMENTS

| | | | | |
|---|---|---|---|---|
| 4,502,447 A | * | 3/1985 | Schnürle | ................. F02D 41/22 |
| | | | | 123/479 |
| 5,684,294 A | | 11/1997 | Kouhi | |
| 5,949,539 A | * | 9/1999 | Britton, Jr. | ............. G01K 11/20 |
| | | | | 250/458.1 |
| 7,714,265 B2 | | 5/2010 | Fadell et al. | |
| 8,125,619 B2 | | 2/2012 | Chang et al. | |
| 8,169,160 B2 | * | 5/2012 | Yan | .................... H05B 33/0815 |
| | | | | 315/209 R |
| 8,330,388 B2 | * | 12/2012 | Kuo | .................... H05B 33/0818 |
| | | | | 315/224 |
| 8,692,200 B2 | | 4/2014 | Tao et al. | |
| 8,779,361 B2 | | 7/2014 | Costello et al. | |
| 9,397,475 B2 | * | 7/2016 | Goto | ....................... H01S 5/062 |

(Continued)

*Primary Examiner* — Christine S. Kim
(74) *Attorney, Agent, or Firm* — Treyz Law Group, P.C.; G. Victor Treyz; Joseph F. Guihan

(57) ABSTRACT

An electronic device may have control circuitry and input-output components. The input-output components may include audio components, sensors, and other devices. A proximity sensor may supply the control circuitry with proximity sensor data. The control circuitry may adjust the audio components or take other suitable action in response to proximity sensor readings from the proximity sensor. The proximity sensor may have a light source such as an infrared laser diode and a light detector that measures a reflected portion of infrared light pulses emitted by the infrared laser diode. The control circuitry may include circuitry for safely producing pulses of emitted light with the light source. This circuitry may include a signal generator that produces ramped pulses, a differentiator that differentiates the ramped pulses to produce differentiated pulses, and an output driver that produces current pulses for the light source based on the differentiated pulses.

19 Claims, 4 Drawing Sheets

(56) References Cited

U.S. PATENT DOCUMENTS

| | | | | |
|---|---|---|---|---|
| 2006/0092099 A1* | 5/2006 | Matsuda | H04B 10/502 | 345/46 |
| 2007/0104232 A1* | 5/2007 | Baumgartner | H01S 5/042 | 372/30 |
| 2011/0080533 A1* | 4/2011 | Champion | H04N 9/3129 | 348/744 |
| 2011/0133941 A1* | 6/2011 | Yao | G01J 1/02 | 340/600 |
| 2013/0107000 A1* | 5/2013 | Xue | G01S 17/023 | 348/46 |
| 2014/0125234 A1* | 5/2014 | Sadwick | H05B 37/0218 | 315/158 |
| 2014/0211192 A1* | 7/2014 | Grootjans | H05B 33/0818 | 356/5.01 |
| 2014/0247847 A1* | 9/2014 | Cox | H01S 5/06817 | 372/38.01 |
| 2014/0265935 A1* | 9/2014 | Sadwick | H05B 33/0815 | 315/307 |
| 2015/0018649 A1* | 1/2015 | Lisogurski | H05B 33/0842 | 600/323 |
| 2015/0196239 A1* | 7/2015 | Meehan | A61B 5/14552 | 600/323 |
| 2015/0271880 A1* | 9/2015 | Wallius | H05B 33/0815 | 315/294 |
| 2016/0029455 A1* | 1/2016 | Aydin | H05B 33/0827 | 315/193 |
| 2016/0295649 A1* | 10/2016 | Davidovic | H05B 33/0815 | |
| 2018/0013357 A1* | 1/2018 | Palmer | H05B 33/0848 | |

* cited by examiner

LIGHT SOURCE DRIVING CIRCUITRY FOR ELECTRONIC DEVICES

BACKGROUND

This relates to electronic devices with components that include light sources and, more particularly, to circuitry for controlling components with light sources.

Electronic devices often include components that have light sources. For example, cellular telephones and other devices sometimes have light-based components such as light-based proximity sensors. A light-based proximity sensor may have a light source such as an infrared light-emitting diode and may have a light detector. During operation, the light source emits light. In the presence of nearby objects, some of the emitted light is reflected back towards the proximity sensor and is detected by the light detector. By monitoring the amount of reflected light at the light detector, an electronic device may determine whether an external object is in the vicinity of the electronic device.

It would be desirable to be able to provide fault-tolerant light source control circuitry that helps ensure that emitted light from a light source is not too bright.

SUMMARY

An electronic device may have control circuitry and input-output components. The input-output components may include audio components, sensors, and other devices. A proximity sensor may supply the control circuitry with proximity sensor data. The control circuitry may adjust the audio components or take other suitable action in response to proximity sensor readings from the proximity sensor.

The proximity sensor may be a light-based proximity sensor having a light source such as an infrared laser diode and a light detector that measures a reflected portion of infrared light pulses emitted by the infrared laser diode.

The control circuitry may include circuitry for safely producing pulses of emitted light with the light source. This circuitry may include a signal generator that produces ramped pulses, a differentiator that differentiates the ramped pulses to produce differentiated pulses, and an output driver that produces current pulses for the light source based on the differentiated pulses.

The signal generator may include a digital-to-analog converter that produces a reference voltage that helps adjust peak current pulse magnitude and may include an operational amplifier for producing the ramped pulses based on feedback from the output driver. Switches that are controlled by the control circuitry may be used to make duty cycle adjustments to the current pulses and thereby help adjust light source output intensity.

DETAILED DESCRIPTION

Electronic devices may be provided with light-based components. The light-based components may include, for example, light-based proximity sensors. A light-based proximity sensor may have a light source such as an infrared light source and may have a light detector that detects whether light from the infrared light source has been reflected from an external object in the vicinity of an electronic device. Light sources may also be used as part of light-based transceivers, status indicator lights, displays, light-based touch sensors, light-based switches, and other light-based components. Illustrative configurations in which an electronic device is provided with a light-based component such as a light-based proximity sensor may sometimes be described herein as an example.

Figure 1:
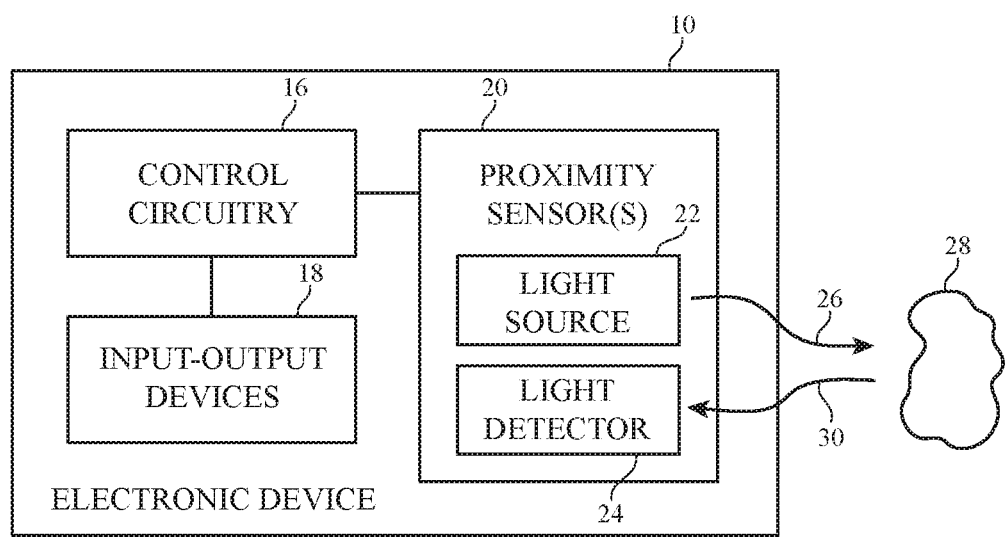
FIG. 1 is a schematic diagram of an illustrative electronic device in accordance with an embodiment.

FIG. 1 is a schematic diagram of an illustrative electronic device of the type that may include a light-based proximity sensor. Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device such as a set of wireless or wired earbuds, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, an accessory (e.g., earbuds, a remote control, a wireless trackpad, etc.), or other electronic equipment.

As shown in FIG. 1, device 10 may include storage and processing circuitry such as control circuitry 16. Circuitry 16 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in circuitry 16 may be used to control the operation of device 10. This processing circuitry may be based on one or more microprocessors, microcontrollers, digital signal processors, baseband processor integrated circuits, application specific integrated circuits, other circuits with logic circuitry for producing digital control signals, etc.

Circuitry 16 may be used to run software on device 10. The software may control the operation of sensors and other components in device 10. For example, the software may allow circuitry 16 to control the operation of light-based proximity sensors and to take suitable actions based on proximity data gathered from the light-based proximity sensors. As an example, a light-based proximity sensor may be used to detect when a wireless earbud is in the ear of a user or may be used to detect when other user body parts are in the vicinity of an electronic device. Based on information on whether or not the earbud is in the ear of a user or is otherwise in a particular position relative to a user, the software running on control circuitry 16 may adjust audio output and/or media playback operations, may change the operation of communications functions (e.g., cellular telephone operations) for a paired cellular telephone or other additional device that is associated with the earbud, or may take other suitable action.

To support interactions with external equipment, circuitry 16 may be used in implementing communications protocols.

Communications protocols that may be implemented using circuitry 16 include wireless local area network protocols (e.g., IEEE 802.11 protocols—sometimes referred to as WiFi®), protocols for other short-range wireless communications links such as the Bluetooth® protocol, cellular telephone protocols, near-field communications protocols, and other wireless communications protocols.

Device 10 may include input-output devices 18. Input-output devices 18 may be used to allow data to be supplied to device 10 and to allow data to be provided from device 10 to external devices. Input-output devices 18 may include touch screens, displays without touch sensor capabilities, buttons, joysticks, scrolling wheels, touch pads, key pads, keyboards, microphones, cameras, speakers, status indicators, light sources, audio jacks and other audio port components, light sensors, accelerometers, and other sensors, and input-output components. These components may include light-based components such as components with light sources. As shown in FIG. 1, device 10 may a light-based component such as one or more light-based proximity sensor(s) 20.

Proximity sensor 20 may include light source 22. Light source 22 may emit light 26 that has the potential to be reflected from external objects such as object 28 (e.g., the ear or other body part of a user, inanimate objects, or other objects). Light detector 24 may measure how much of emitted light 26 is reflected towards device 10 as reflected light 30 and may therefore be used in determining whether an external object such as object 28 is present in the vicinity of device 10.

Light 26 may be infrared light, visible light, or ultraviolet light. Infrared light is not visible to a user and is detectable by semiconductor infrared light detectors, so it may be desirable to form light source 22 from a component that emits infrared light. Light source 22 may be a light-emitting component such as a light-emitting diode or a laser diode (as examples). Laser diodes such as vertical cavity surface emitting laser diodes may emit a more concentrated beam of light than light-emitting diodes. By using a laser diode in place of a light-emitting diode, emitted light 26 may be concentrated towards potential external objects such as external object 28 without the need to add lenses or other ancillary structures to light source 22. This may help minimize the size of the light source structures in device 10. If desired, light source 22 may be formed from a light-emitting diode such as a light-emitting diode having a light-concentrating lens. Illustrative configurations for proximity sensor 20 in which light source 22 is an infrared laser diode such as an infrared vertical cavity surface emitting laser diode may sometimes be described herein as an example.

Figure 2:
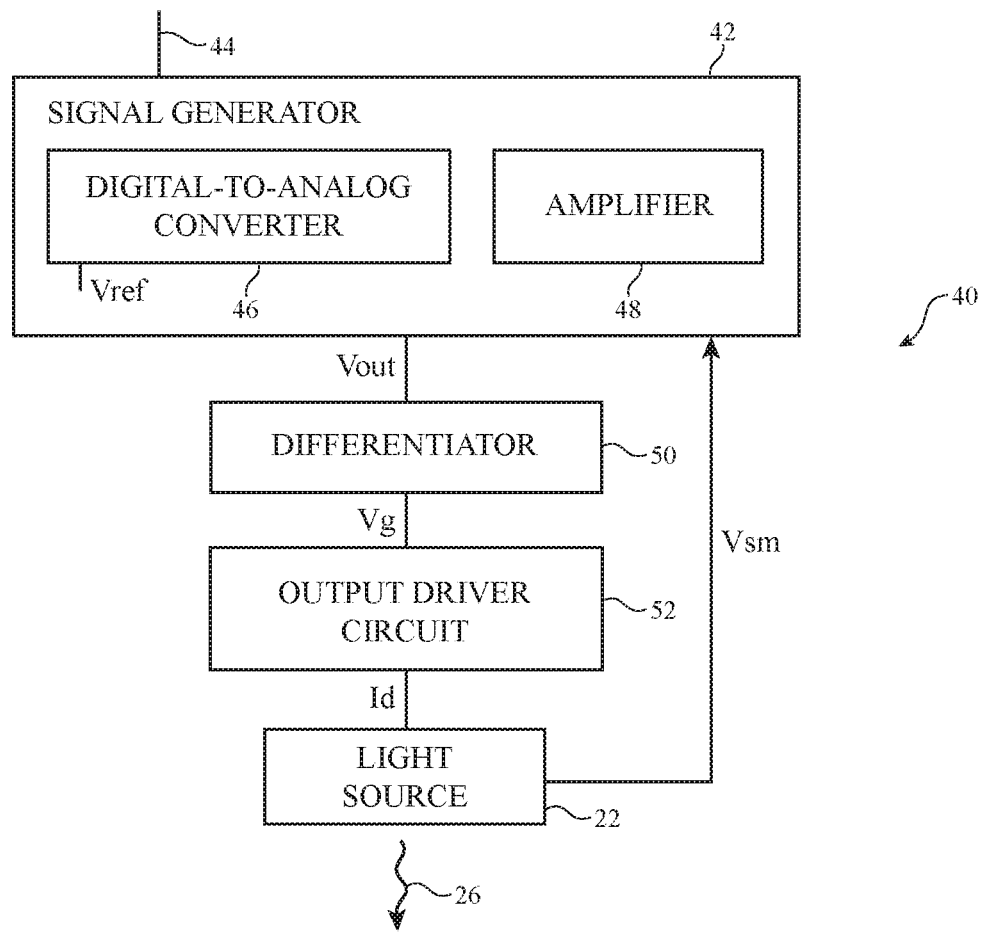
FIG. 2 is a schematic diagram of an illustrative control circuit for a light source such as a light source in a light-based component such as a proximity sensor in accordance with an embodiment.

FIG. 2 is a schematic diagram of an illustrative control circuit that may be used in supplying drive signals to a light source such as a proximity sensor light source. Control circuit 40 of FIG. 2 may form part of control circuitry 16 of FIG. 1 and may receive control signals from microprocessor circuitry, application-specific integrated circuit circuitry, and/or other logic circuitry in control circuitry 16 on control paths such as control path 44. The control signals that are received on path 44 may be, for example, digital control signals that adjust the operation of transistor-based switches or other switches in circuitry 40.

Circuitry 40 may include a signal generator such as signal generator 42. Signal generator 42 may include a digital-to-analog converter and an amplifier such as amplifier 48. If desired, signal generator 42 may include other signal generator circuitry. The configuration used for the circuitry of signal generator 42 of FIG. 2 is merely illustrative.

Signal generator 42 may include circuitry for generating output signals Vout in response to control signals on path 44. Output signals Vout may be ramped signal pulses (e.g., signal pulses with ramped portions). Output signals Vout that are received by differentiator circuitry such as differentiator 50. Differentiator 50 may perform a differentiation operation on the ramped pulses from signal generator 42 and may produce corresponding differentiated signal pulses. The differentiated signals (signals Vg) at the output of differentiator 50 may be applied to output driver circuit 52. Output driver circuit 52 may supply pulses of drive current Id to light source 22 (e.g., a laser diode) in response to the differentiated signal pulses from differentiator 50. Light source 22 emits light 26 in response to the amount of current Id that is passing through light source 22. Feedback Vsm (e.g., feedback from light source 22 that indicates how much current Id is passing through light source 22) may be provided to signal generator 42.

Due to the presence of differentiator 50, control circuitry 40 is inherently safe. In order to emit a pulse of light 26, an appropriate signal pulse Vout such as a ramped pulse must be produced by signal generator 42. A ramped pulse Vout that is differentiated by differentiator 50 results in a differentiated pulse Vg of constant value. This, in turn, results in a current pulse Id with a constant current value and a corresponding pulse of constant magnitude in emitted light 26. In the event that a fault creates a constant Vout value, differentiator 50 will convert the constant Vout value to produce an output Vg of zero. Output driver circuit 52 will take Id to zero in response to receiving a Vg value of zero at its input, so no light 26 will be emitted whenever Vout is held constant. As this example demonstrates, even if Vout is set to a constant non-zero value for a long period of time (e.g., due to a fault), the output of light source 22 will be zero. Only by supplying an output pulse Vout that ramps continuously upward (which differentiator 50 converts into a differentiated pulse of constant value), can output driver circuit 52 be directed to supply an appropriate pulse of drive current Id to light source 22.

During operation of light-based proximity sensor 20, a series of pulses of current Id and therefore a series of corresponding pulses of emitted light 26 may be created. For example, signal generator 42 can create a series of ramped pulses (ramped Vout pulses). As each pulse is applied to differentiator 50, differentiator 50 may convert the ramped pulse into a corresponding differentiated pulse (e.g., s constant-value pulse Vg). Output driver circuit 52 can receive the differentiated pulses from differentiator 50 and can produce corresponding pulses of drive current Id for light source 22. Pulse height and/or pulse duty cycle can be adjusted to adjust emitted light output intensity.

Digital-to-analog converter 46 of signal generator 42 may produce an output signal (reference voltage) Vref at an output. A feedback signal (Vsm) may be produced at a node coupled to light source 22 and may be proportional to the current Id flowing through light source 22. The node at Vsm and the output of the signal generator at Vref are coupled to an input of amplifier 48 and thereby influence the output of amplifier 48. During operation, control circuitry 16 can supply a control signal to digital-to-analog converter 46 on path 44 that is used to produce a desired value of Vref. The value of Vref may be adjusted to control the signal supplied to the input of amplifier 48 and thereby adjust the magnitude of the pulse height for the pulses of current Id supplied to light source 22. Switches within signal generator 42 may also be turned on and off in accordance with timing control signals from control circuitry 16 that are received via path 44. The times at which the switches are turned on and off can be used to adjust pulse duty cycle for current Id and therefore the amount of light 26 that is produced by source 22.

Figure 3:
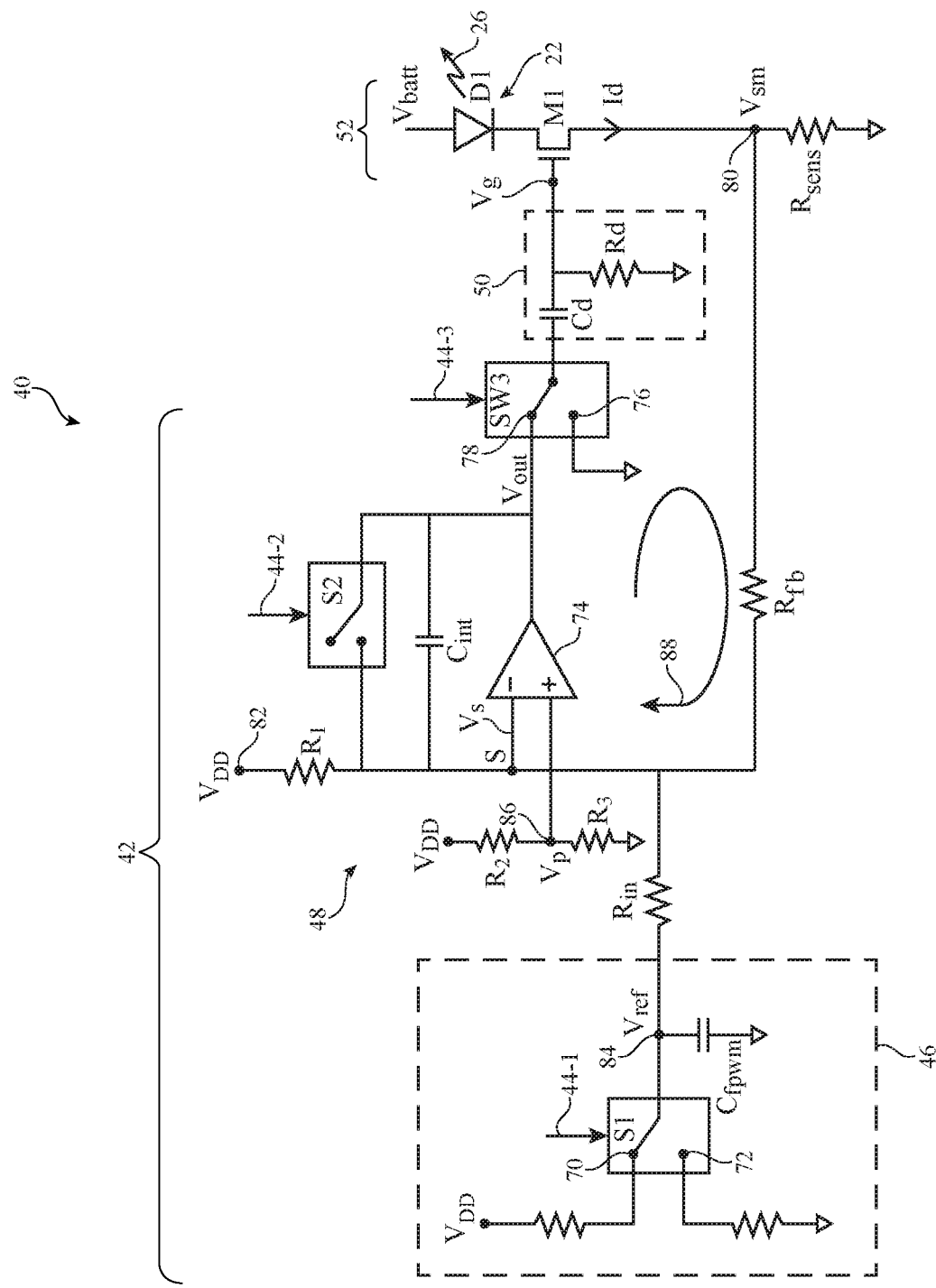
FIG. 3 is a circuit diagram of an illustrative control circuit for a light source in accordance with an embodiment.

Illustrative circuitry for implementing control circuitry 40 of FIG. 2 is shown in FIG. 3. As shown in FIG. 3 control circuitry 40 may include signal generator 42 (e.g., digital-to-analog converter 46 and amplifier circuitry 48), differentiator 50, output driver circuit 52, and light source 22 (e.g., laser diode D1).

In the example of FIG. 3, digital-to-analog converter 46 has a switch 51 that receives control signals on input 44-1 from a microprocessor or other controller in circuitry 16. Switch 51 is connected alternately to either terminal 70 or 72 depending on the state of the control signal received at the switch input 44-1. Terminal 70 is connected to positive power supply Vdd. Terminal 72 is coupled to ground. The control signal 44-1 may be a pulse-width-modulation (PWM) control signal with a duty cycle that determines the voltage Vref that is stored on capacitor Cfpwm. Voltage Vref serves as the output from digital-to-analog converter 46. Amplifier circuit 48 includes operational amplifier 74. Amplifier 74 has a non-inverting input (+) that receives reference voltage Vp from a voltage divider formed from resistors R2 and R3. Resistors R2 and R3 may be coupled in series between supply Vdd and ground. Operational amplifier 74 also has an inverting input (−) that receives a signal Vs from node S. Node S and therefore inverting input (−) is coupled to node 80, which is at a voltage Vsm that is proportional to current Id, via a feedback path through resistor Rfb and is coupled to the output of digital-to-analog converter 46.

Operational amplifier 74 has an output that supplies signal Vout in response to the input signals on inverting input (−) and non-inverting input (+). Capacitor Cint is coupled between the output of amplifier 74 and node S and serves as a stabilizing element that helps to limit the speed with which the voltage Vout can change. Switch S2 may be coupled between the output of amplifier 74 and node S in parallel with capacitor Cint. Switch S2 may be controlled by control signals 44-2 from control circuitry 16 and may be closed whenever it is desired to clear capacitor Cint and thereby reset amplifier 74. If desired, amplifier 74 may be reset using other reset switch configurations such as a configuration in which a reset switch selectively shorts node 86 to ground.

Switch S3 may be controlled by control signals 44-3 from control circuitry 16. Switch S3 may be coupled to node 78 when it is desired to supply a ramped pulse from the output of amplifier 74 to differentiator 50 and may be coupled to ground at node 76 to clear differentiator 50 between pulses.

Differentiator 50 may include a capacitor Cd that is coupled in series between node 78 and the gate of drive transistor M1. Differentiator 50 may also have a resistor Rd that is coupled between the gate of transistor M1 and ground. When a constant signal is applied to node 78, differentiator 50 will take the gate of M1 (i.e., signal Vg) to zero (because the derivative of a constant is zero). When a ramped signal is applied to node 78, differentiator 50 will take Vg to a value that is proportional to the slope of the linear ramp signal.

Diode D1 and drive transistor M1 are coupled in series with sense resistor Rsens between positive power supply Vbatt and ground. The voltage Vsm at node 80 (Rsens*Id) is proportional to drive current Id and therefore is proportional to the magnitude of emitted light 26. Voltage Vsm may produce a feedback signal that is conveyed to the input of amplifier 74 via node S.

Node S at inverting input (−) of operational amplifier 74 is coupled to nodes 80, 82, and 84 and is therefore influenced by voltage Vdd at node 82, voltage Vsm at node 80, and voltage Vref at node 84. As a result, adjustments in Vref can be made to adjust the output of amplifier 74 (i.e., to adjust pulse height). Control circuitry 16 may also produce control signals that adjust the duration and frequency of current pulses Id and thereby control output power for light 26. For example, control circuitry 16 may control the timing of the control signals 44-2 and 44-3 for respective switches S2 and S3 to adjust pulse width and pulse frequency.

Figure 4:
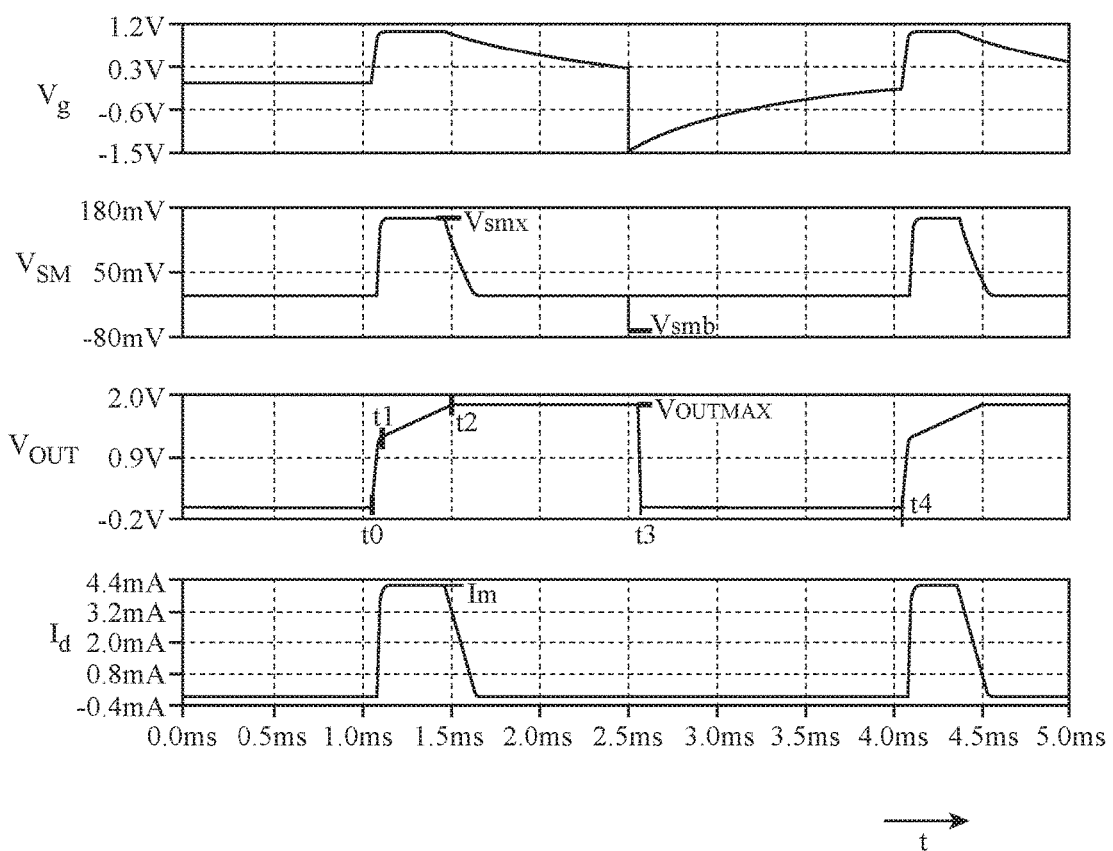
FIG. 4 is a timing diagram that includes signal traces associated with operation of the control circuitry of FIG. 3 in accordance with an embodiment.

A timing diagram illustrating the operation of circuitry 40 of FIG. 3 is shown in FIG. 4. There are four signal traces in the diagram of FIG. 4 (voltage Vg at the gate of transistor M1, voltage Vsm on current sensing node 80, operational amplifier output voltage Vout on node 78, and current Id), each of which has been plotted as a function of time t.

At time t0, switch S2 is opened and switch S3 is closed to begin production of a drive current pulse (i.e., a pulse in current Id). The voltage Vsm on node 80 is initially low (i.e., 0 volts or other suitable ground level), because transistor M1 is off. The difference in voltage Vs on node S and reference voltage Vp causes amplifier 74 to rapidly ramp up output signal Vout (times t0-t1). The ramp rate of signal Vout between times t0 and t1 is limited by capacitor Cint, which restricts the speed at which the voltage on node S may rise.

The rising value of Vout causes Vg to rise. At time t1, Vg exceeds the threshold voltage Vth of transistor M1 and transistor M1 is turned on. This causes current Id to rise to value Im (i.e., the current pulse for driving diode D1 has been started). The corresponding voltage Vsm is equal to Rsens*Id (i.e., Vsm is equal to Vsmx, which is equal to Rsens*Id).

Between times t1 and t2, feedback loop 88 is active and amplifier 74 operates as an inverting amplifier (of approximate gain Rfb/Rin). Amplifier 74 produces an output Vout that results in a voltage Vsm on node 80 that maintains Vs at Vp. Due to the presence of differentiator 52, the shape of output Vout that is produced under these feedback conditions is a linear ramp, as shown by the curve segment for Vout between times t1 and t2 in FIG. 4. The ramp rate of Vout between times t1 and t2 is determined by the gain of differentiator 52 (e.g., a smaller gain results in a higher ramp rate). Capacitor Cint provides stability by limiting the maximum rate at which Vs can change during time t0 to t1 and may also help ensure that a direct current (DC) signal into node S will produce a linear ramp in output Vout.

At time t2 in the FIG. 4 example, Vout saturates at its positive power supply rail (i.e., Vout reaches Voutmax). In the event that Vout becomes constant at Voutmax in this way, the derivative of Vout (i.e., signal Vg) that is produced by differentiator 52 will go to zero, thereby causing the current pulse (pulse in current Id) to terminate. In the event of a fault, Vout may be stuck at a constant maximum output value such as value Voutmax. But due to the presence of differentiator 52, the resulting control signal Vg on the gate of transistor M1 will be low and current Id will naturally go low and shut off diode D1. Control circuitry 40 therefore enhances safety by preventing erroneous emission of light 26.

At time t3, switch S2 is closed to reset amplifier 74 by clearing capacitor Cint and switch S3 is coupled to ground node 76 to clear capacitor Cd of differentiator 52. This causes Vout to go low. Vg drops at t3, because switch S3 is coupled to ground. Capacitive coupling between the gate and source of transistor M1 due to the non-zero gate-source capacitance Cgs of transistor M1 causes the voltage Vsm to momentarily drop to Vsmb. When it is desired to create another pulse in drive current Id (i.e., at time t4 in the example of FIG. 4), switch S3 is switched to node 78 and switch S2 is closed.

In the simulation of FIG. 4, Vout is constant at Voutmax from t2 to t3 to demonstrate the inherent safety of circuit 40. If desired, the portion of output curve Vout between t2 and t3 can be shortened or eliminated to conserve power (i.e., S2 may be closed at time t2 and switch S3 may be grounded to node 76 at time t2).

The average output power of light 26 emitted by diode D1 is determined by the peak value of current Id and the duty cycle of the pulses of drive current Id. Nodes 80, 82, and 84 are coupled by resistors to node S, so voltage Vref influences the feedback current flowing into node S from node 80. The magnitude of Vref can therefore be adjusted to adjust the magnitude of current Id (i.e., maximum drive current Im of the drive current pulses is controlled by adjustment of Vref with digital-to-analog converter 46). The times at which switches S2 and S3 are switched controls the duty cycle of the drive current pulses. With one illustrative scenario, current Im is about 2-10 mA, the width of each current pulse is about 0.5-2 ms, and the pulse frequency of the current pulses is about 25-55 Hz. Other peak current values, pulse widths, and pulse frequencies may be used, if desired.

The foregoing is merely illustrative and various modifications can be made by those skilled in the art without departing from the scope and spirit of the described embodiments. The foregoing embodiments may be implemented individually or in any combination.

What is claimed is:

1. Circuitry, comprising:
a signal generator that produces ramped pulses;
a differentiator that differentiates the ramped pulses to produce differentiated pulses;
a light source; and
an output driver circuit that receives the differentiated pulses and that supplies corresponding signal pulses to the light source, wherein the output driver circuit comprises a transistor having a gate that receives the differentiated pulses and wherein an output power of light emitted by the light source is controlled by the signal pulses.

2. The circuitry defined in claim 1 wherein the signal generator includes an operational amplifier having an output.

3. The circuitry defined in claim 2 wherein the differentiator comprises a capacitor that is coupled in series between the output of the operational amplifier and the gate of the transistor.

4. The circuitry defined in claim 3 further comprising:
a switch between the output of the operational amplifier and the capacitor; and
control circuitry that controls the switch to produce the ramped pulses.

5. The circuitry defined in claim 4 wherein the light source comprises an infrared laser diode that produces infrared light at the output power and wherein the control circuitry controls the switch to produce the ramped pulses to control the output power.

6. The circuitry defined in claim 5 further comprising:
a light-based proximity sensor that includes the infrared laser diode and that includes a light detector that measures infrared light from the infrared laser diode that has reflected from an object.

7. The circuitry defined in claim 1 further comprising:
control circuitry, wherein the signal generator includes a digital-to-analog converter controlled by a control signal from the control circuitry.

8. The circuitry defined in claim 7 wherein the digital-to-analog converter comprises:
a first terminal coupled to a positive power supply;
a second terminal coupled to ground;
a capacitor; and
a switch that is controlled by the control signal and that is configured to alternately couple the first terminal and the second terminal to the capacitor.

9. The circuitry defined in claim 8 wherein the light source comprises a diode and wherein the circuitry further comprises a resistor coupled in series with the transistor and the diode.

10. The circuitry defined in claim 9 further comprising a signal path coupled between the resistor and a node, wherein the capacitor of the digital-to-analog converter is coupled to the node, and wherein the signal generator includes an operational amplifier that receives signals from the node.

11. The circuitry defined in claim 10 further comprising an additional switch that is controlled by the control circuitry, wherein the additional switch is interposed between the differentiator and an the output of the operational amplifier.

12. The circuitry defined in claim 11 further comprising:
an additional capacitor coupled between the output of the operational amplifier and the node; and
a further switch coupled between the output of the operational amplifier and the node in parallel with the additional capacitor.

13. The circuitry defined in claim 1 wherein the signal generator comprises an operational amplifier having an output, the circuitry further comprising:
a switch coupled between the output and the differentiator.

14. A method, comprising:
with a signal generator that includes an operational amplifier, supplying signal pulses to a differentiator;
with the differentiator, differentiating the signal pulses to produce differentiated pulses;
with an output driver circuit, supplying drive signal pulses to a light source in response to receiving the differentiated pulses; and
with the light source, emitting pulses of infrared light in response to the drive signal pulses.

15. The method defined in claim 14 wherein the light source forms part of a light-based proximity sensor having a light detector, and wherein the method further comprises:
measuring reflected portions of the pulses of infrared light with the light detector to produce proximity sensor data.

16. The method defined in claim 14 wherein the output driver circuit comprises a transistor having a gate that receives the differentiated pulses and wherein the differentiator comprises a capacitor that is coupled in series between an output of the operational amplifier and the gate of the transistor.

17. An electronic device, comprising:
a proximity sensor having a light source that is controlled by current pulses to produce pulses of infrared light and having a light detector that measures reflected portions of the pulses of infrared light to produce proximity sensor readings; and control circuitry coupled to the proximity sensor, wherein the control circuitry includes:
a signal generator that produces signal pulses;
a differentiator that differentiates the signal pulses to produce differentiated signal pulses, wherein the signal generator includes an operational amplifier and a switch coupled between the operational amplifier and the differentiator; and
an output driver circuit that receives the differentiated signal pulses and that supplies the current pulses to the light source based on the differentiated signal pulses.

18. The electronic device defined in claim 17 wherein the output driver circuit includes a transistor having a gate that receives the differentiated signal pulses.

19. The electronic device defined in claim 18 further comprising a capacitor coupled between an output of the operational amplifier and an input of the output driver circuit.

* * * * *